(12) United States Patent
Jeng et al.

(10) Patent No.: US 6,449,748 B1
(45) Date of Patent: Sep. 10, 2002

(54) NON-DESTRUCTIVE METHOD OF DETECTING DIE CRACK PROBLEMS

(75) Inventors: Edward Jewjing Jeng, Fremont; Lamberto Beleno, Milpitas; Steve Kehchien Hsuing, Sunnyvale, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/370,856

(22) Filed: Aug. 9, 1999

(51) Int. Cl.[7] .......................... G06F 17/50; H01L 23/58
(52) U.S. Cl. ............................................. 716/4; 257/48
(58) Field of Search ........................... 716/4, 5; 257/48

(56) References Cited

U.S. PATENT DOCUMENTS 5,654,896 A * 8/1997 Ochi ........................... 364/488
5,723,875 A * 3/1998 Abe et al. ...................... 257/48
6,094,144 A * 7/2000 Dishongh et al. ........... 340/653

OTHER PUBLICATIONS

Gee et al., "A Test Chip Design for Detecting Thin–Film Cracking in Integrated Circuits," IEEE Trans. on Components, Packaging, and Manufacturing Technology—Part B, vol. 18, No. 3, Aug. 1995, pp. 478–484.*
Sweet, "Assembly Test Chips & Circuits for Detecting and Measuring Mechanical Damage in Packaged ICs," 1994 IEEE IRW Final Report, pp. 30–36.*

* cited by examiner

Primary Examiner—Nathan J. Flynn
Assistant Examiner—Leigh Garbowsk
(74) Attorney, Agent, or Firm—Beyer Weaver & Thomas, LLP

(57) ABSTRACT

Provided is a non-destructive method of detecting die crack problems in an integrated circuit. The method provides for testing for die crack problems in all chips and in many production chips without adding any extra circuitry or pads. In a preferred embodiment, the method takes advantage of an existing NAND gate tree structure at the perimeter of many conventional dies, although the invention is also applicable to other logic gate structures that may exist or may be formed at the perimeter of dies. The invention recognizes that this NAND gate tree structure may be used in order to identify and localize die cracks in finished chips, thereby providing a faster, more accurate and nondestructive way to test for die cracks in production chips. A typical NAND gate tree structure has the form of a cascade inverter chain. Since one end of the first NAND gate is tied to $V_{DD}$, the output of each gate will alternate between low and high. Knowing the number of NAND gates in chain and the input provided to each NAND gate, the output for a properly functioning chain is determinable. If the output received is unexpected, it is an indication of die cracking in the chip. Moreover, by conducting a test pattern where a range, ideally the minimum combination necessary, of inputs is provided at each NAND gate and the output recorded, it is possible to localize the gate and or gates which are not responding properly and thereby localize the die crack.

22 Claims, 5 Drawing Sheets

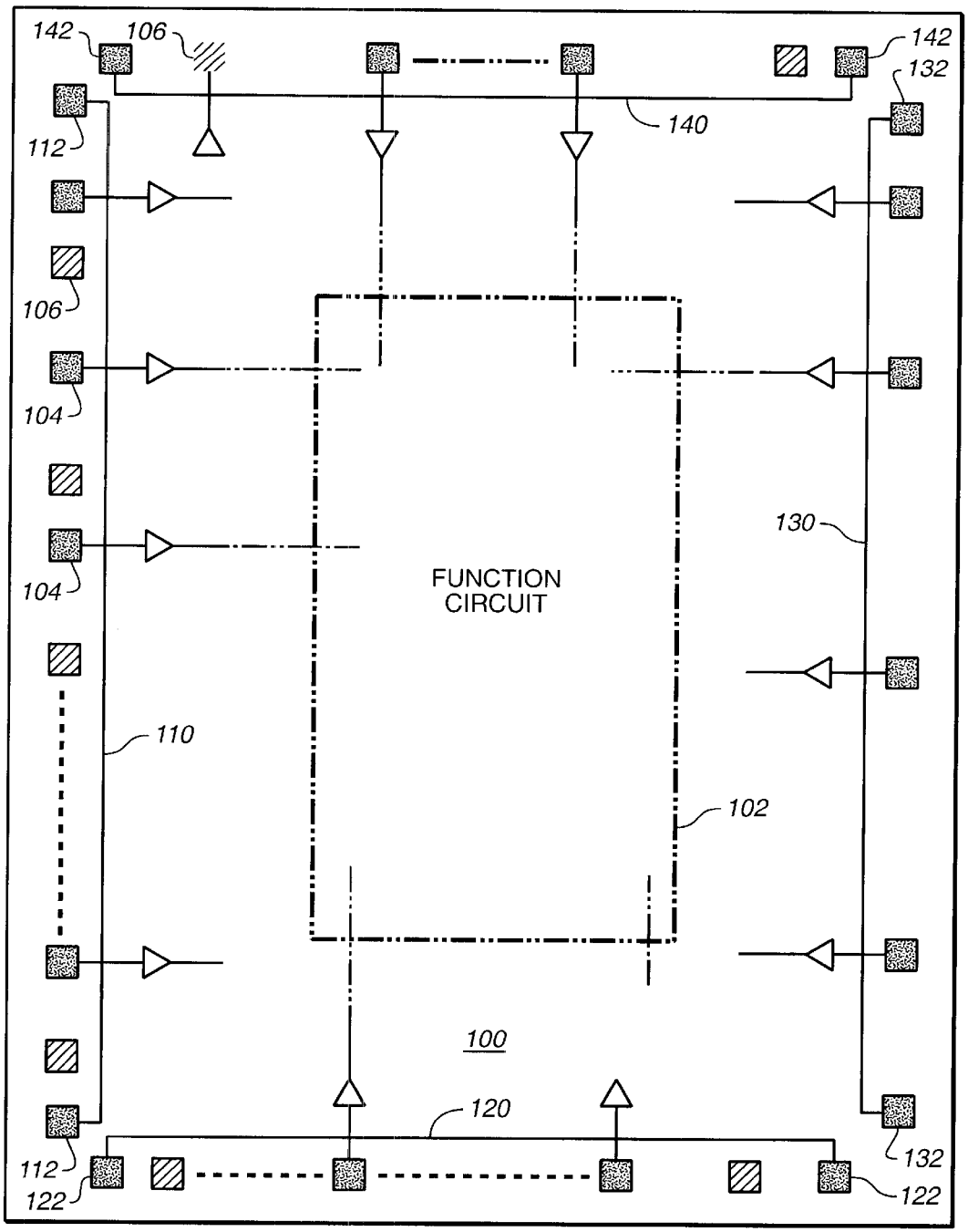
FIG._1

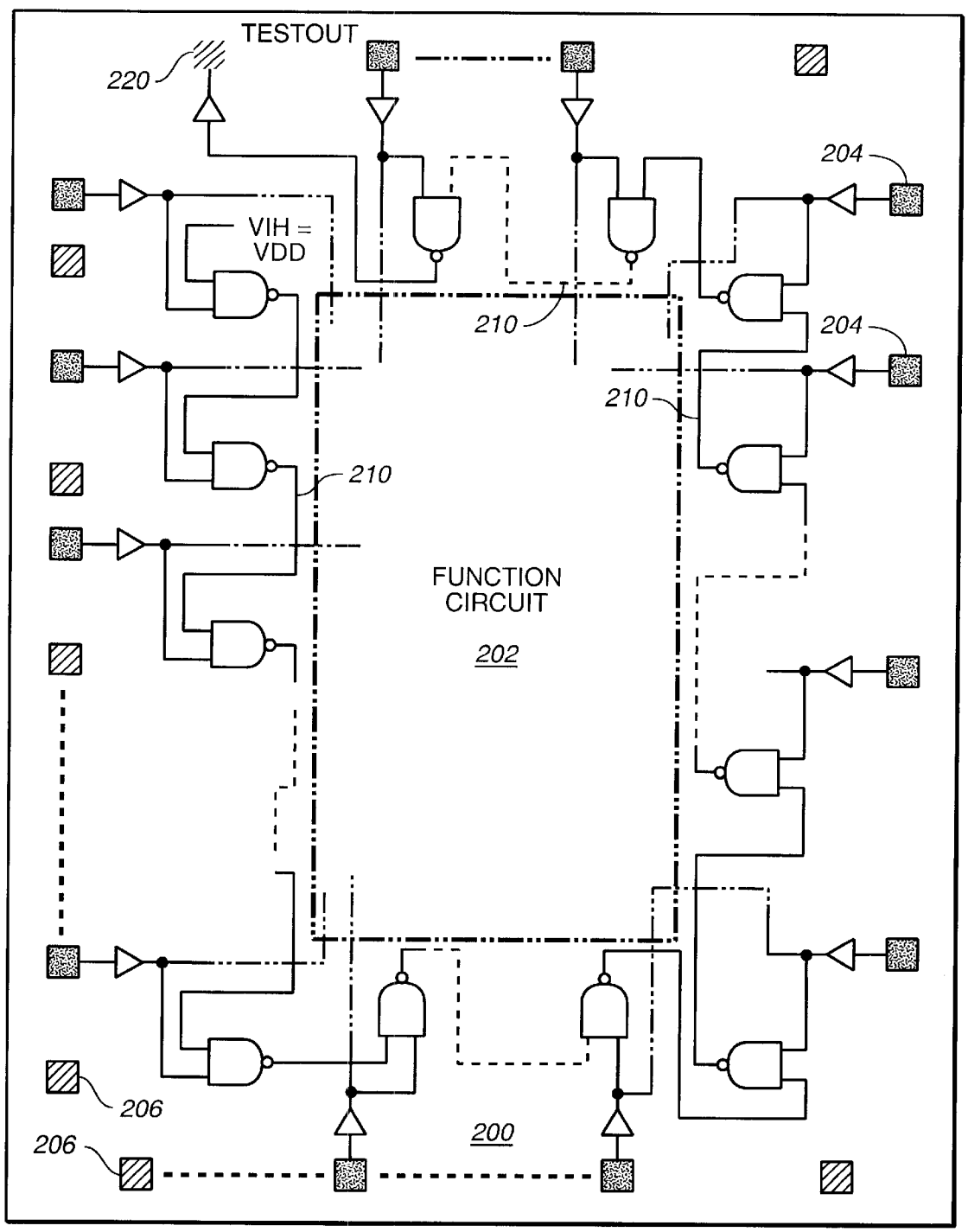
FIG._2

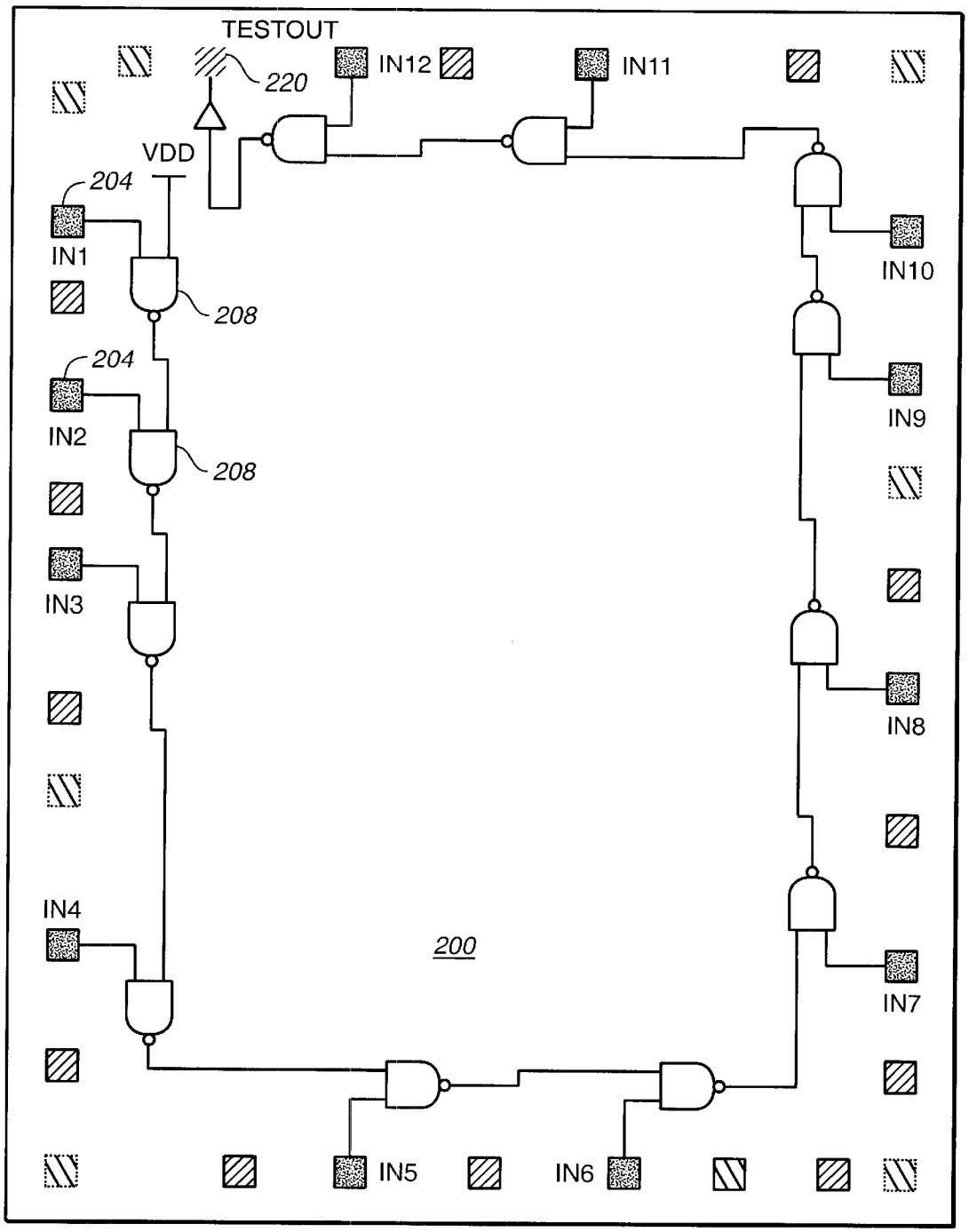
FIG._3

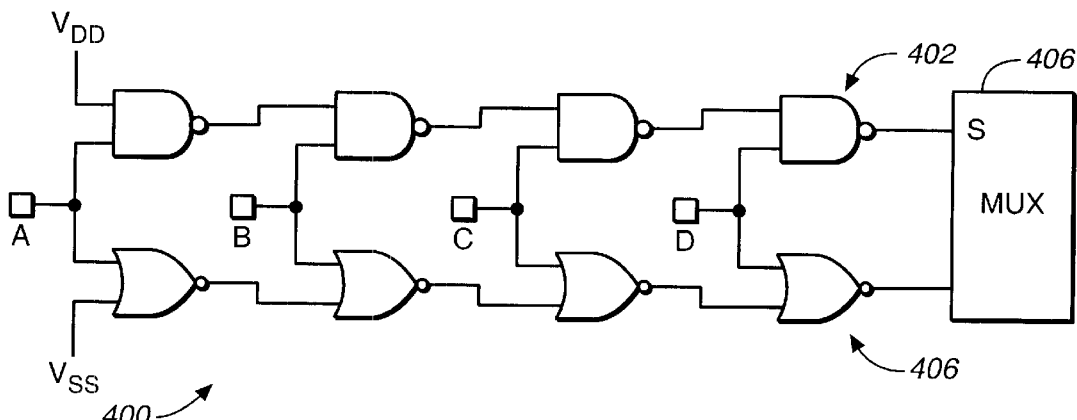
FIG._4
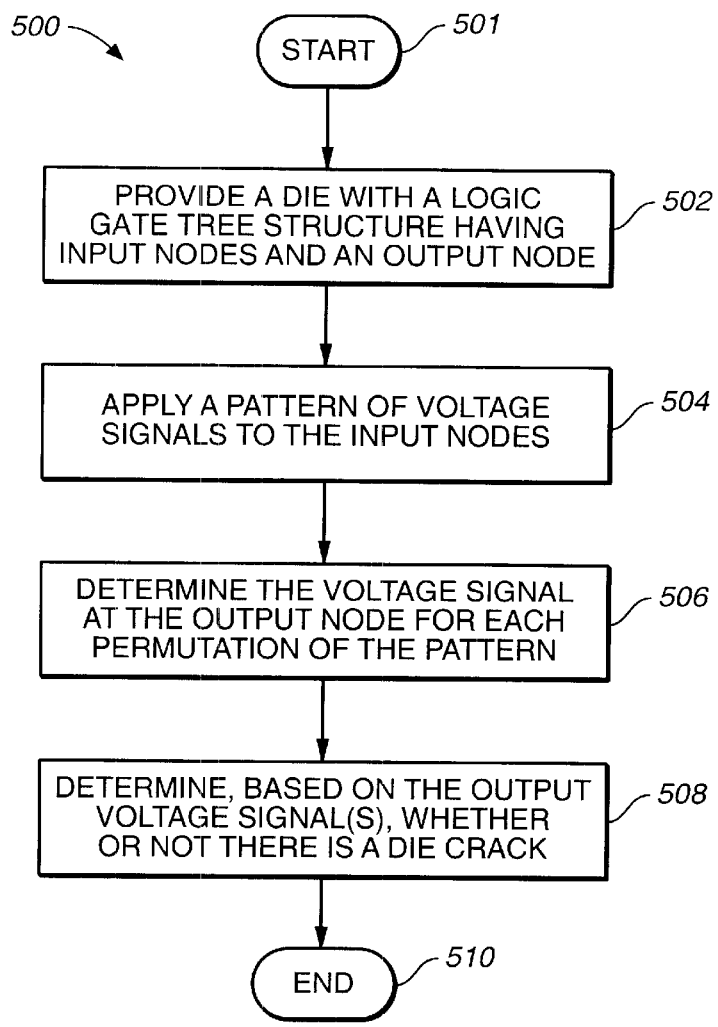
FIG._5

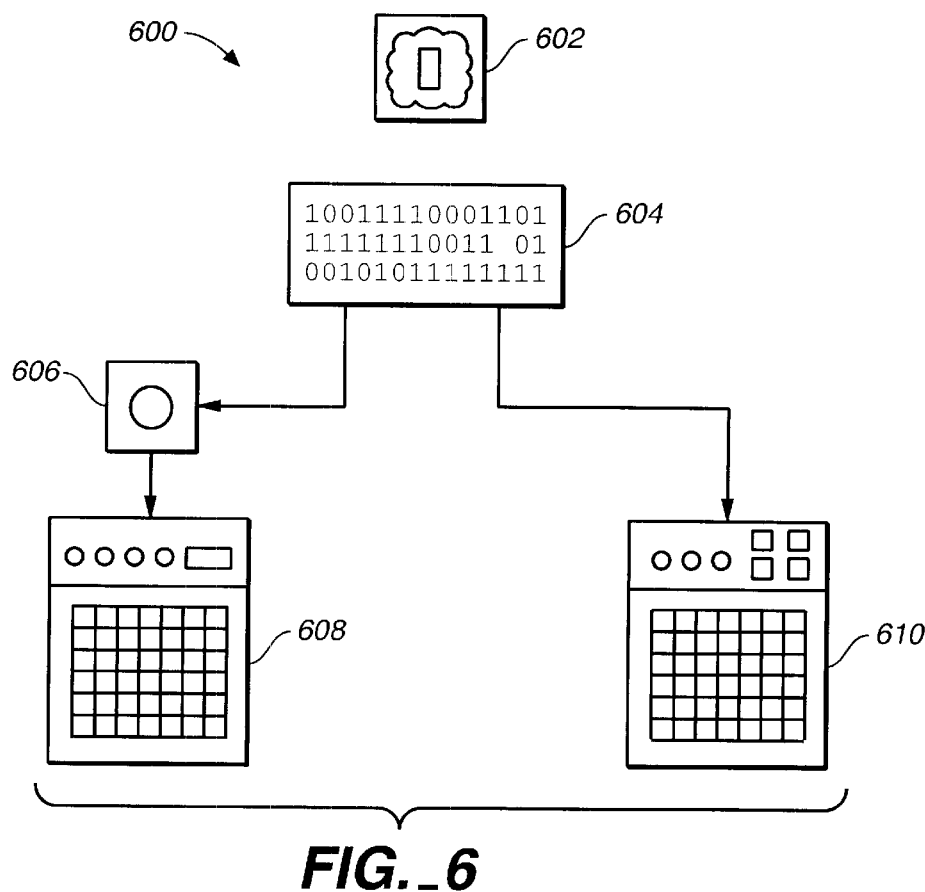
FIG._6
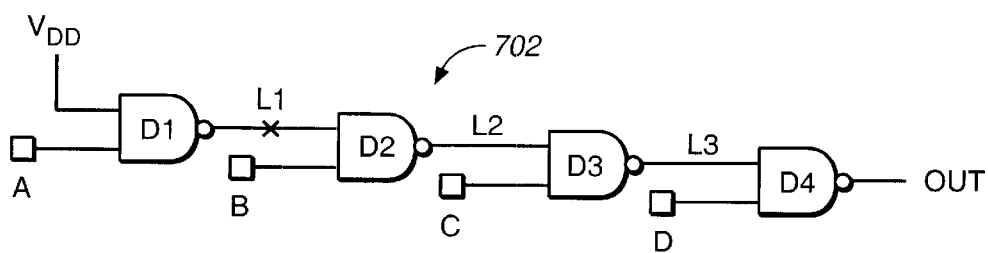
| Vector | A | B | C | D | Out |
|---|---|---|---|---|---|
| 1st | 1 | 1 | 1 | 1 | 1 |
| 2nd | 0 | 1 | 1 | 1 | 0 |
| 3rd | 1 | 0 | 1 | 1 | 1 |
| 4th | 1 | 1 | 0 | 1 | 0 |
| 5th | 1 | 1 | 1 | 0 | 1 |
FIG._7

NON-DESTRUCTIVE METHOD OF DETECTING DIE CRACK PROBLEMS

BACKGROUND OF THE INVENTION

The present invention relates to semiconductor devices. More particularly, the present invention relates to methods for detecting die crack problems in packaged integrated circuits.

Integrated circuits (ICs) are typically formed on a wafer of semiconductor material that is subsequently cut into individual dies for which are then packaged for use in their intended application. Packaged ICs are sometimes referred to as computer "chips." A main concern of semiconductor device fabricators is the reliability of the chips that are shipped to customers. One problem commonly encountered in chips is failure of their circuits due to cracking of the die on which an IC is formed.

One way that semiconductor device fabricators have attempted to control die crack problems is by taking steps to detect them at the process and packaging development stage of device fabrication. During process and packaging development, test dies are subjected to procedures and their associated forces proposed to be used in the fabrication of production chips. In order to test for die cracking problems, guard rings are formed in the test dies for a given process and package. These guard rings are composed of conductive lines between pads formed at the perimeter of the die. A crack in the die results in a break in the conductive line that is detected when a signal applied at a pad at one end of the line is not received by the pad at the other end of the line.

FIG. 1 shows an example of one implementation of guard rings used to detect die crack problems in process and packaging test dies. The test die 100 is shown in simplified form in order to focus on the guard ring aspect of the die 100. The die 100 includes a function circuit 102 surrounded by a number of input nodes (or "pins") 104 and output nodes 106 at the perimeter of the die 100. Also at the perimeter of the die is a guard ring, such as described above. Guard rings are composed of conductive lines, usually of metal, which are formed in one or more layers of a test die. For example the guard rings may be formed in a polysilicon layer, and/or a metal 1 layer, and/or a metal 2 layer, etc. Guard rings typically have between two and eight pads (more than two pads are used when the conductive lines are separated into segments which assists in localization of a crack in the die). In this example, the guard ring is divided into four segments 110, 120, 130 and 140, each with pads 112, 122, 132 and 142, respectively, at either end. Collectively, these segments form a ring around the perimeter of the die 100.

A disconnect in a segment of the guard ring indicates a crack in that region of the die 100. Thus, such guard rings are useful to determine whether or not particular processing or packaging protocol tends to produce die cracking, may be useful to modify or reject process and/or packaging steps that are shown to cause an unacceptable number of die cracks during process and package development. However, it is impractical to place guard rings in actual chips which are produced and sold to customers (production chips) due to the amount of space required on the chip and the additional processing for this additional circuitry. Therefore, such guard rings are not useful in identifying and localizing die cracks in production chips where problems may develop later.

The conventional procedure for identifying and localizing die crack problems in production chips is that the failing chips are returned to the manufacturer, and some or all of the packaging is removed in order to provide access for a visual inspection of the die. This destructive removal of packaging is a process know as "decapping." Decapping procedures vary depending on the particular packaging used for the chip. For example, in the case of PBGA (Plastic Ball Grid Array) and PQFP (Plastic Quad Flat Pack) packages, decapping involves the removal of the polymeric resin covering the die, and in the case of a flip-chip package, decapping involves the removal of the heat spreader. Decapping is both a time consuming and expensive process and is ideally to be avoided.

Accordingly, it would be desirable if a method could be implemented to identify and localize die crack problem in production chips.

SUMMARY OF THE INVENTION

To achieve the foregoing, the present invention provides a non-destructive method of detecting die crack problems in an integrated circuit. The method provides for testing for die crack problems in all chips and in many production chips without adding any extra circuitry or pads. In a preferred embodiment, the method takes advantage of an existing NAND gate tree structure at the perimeter of many conventional dies, for example, the LXA0372 die, manufactured by LSI Logic Corporation, Milpitas, Calif. The invention is also applicable to other logic gate structures that may exist or may be formed at the perimeter of dies.

The invention recognizes that this NAND gate tree structure may be used in order to identify and localize die cracks in finished chips, thereby providing a faster, more accurate and nondestructive way to test for die cracks in production chips. A typical NAND gate tree structure has the form of a cascade inverter chain. Since one end of the first NAND gate is tied to $V_{DD}$, the output of each gate will alternate between low and high. Knowing the number of NAND gates in chain and the input provided to each NAND gate, the output for a properly functioning chain is determinable. If the output received is unexpected, it is an indication of die cracking in the chip. Moreover, by conducting a test pattern where a range, ideally the minimum combination necessary, of inputs is provided at each NAND gate and the output recorded, it is possible to localize the gate and or gates which are not responding properly and thereby localize the die crack.

Since, in a preferred embodiment, this test method requires no new circuitry in a conventional chip design, it is both low cost and efficient use of chip area. A test protocol including a cycle which provides the permutations of inputs to the NAND gates necessary to identify and localize die cracking may be provided to the customer together with the production chip. Thus, if a chip fails, the customer may run the test protocol in order to determine if the failure is due to die cracking rather than some problem with the chips's function circuits, and localize the die crack.

Generally, this method is not restricted to NAND gate tree structures. For example, the input nodes may include NOR logic gates, or a combination thereof. NAND gate tree structures are the preferred embodiment since they are already present in many chip designs.

In one aspect, the present invention provides a method of detecting die crack problems in an integrated circuit. The method involves providing an integrated circuit on a die having a logic gate tree structure around the perimeter of the die. The logic gate tree structure has a plurality of input nodes connected with logic gates and at least one output node. A pattern of voltage signals is applied at the plurality of input nodes, and voltage signals are determined at the at least one output node for the applied pattern of voltage signals. The voltage signals at the at least one output node provide an indication of whether or not there is a die crack.

In another aspect, the present invention provides a system for detecting die crack problems in an integrated circuit. The system includes an integrated circuit on a die having a logic gate tree structure around the perimeter of the die, said logic gate tree structure comprising a plurality of input nodes and at least one output node;

a computer-implemented protocol capable of controlling the application of a pattern of voltage signals at said plurality of input nodes, and determining voltage signals at said at least one output node for said applied pattern of voltage signals;

wherein the voltage signals at the at least one output node provide an indication of whether or not there is a die crack.

These and other features and advantages of the present invention are described below with reference to the drawings.

BRIEF DESCRIPTION OF THE DRAWINGS

FIG. 1 depicts a top schematic view of a simplified process and packaging test die showing a function circuit in the center with a guard ring composed of four segments surrounding the function circuit at the perimeter of the die.

FIG. 2 depicts a top schematic view of a representative production die showing a function circuit in the center with a NAND tree structure surrounding the function circuit at the perimeter of the die.

FIG. 3 depicts a top schematic view of the representative production die of FIG. 2, showing a simplified view of the NAND tree structure at the perimeter of the die.

FIG. 4 illustrates an alternative embodiment in accordance with the present invention, having a logic gate tree composed of a combination of NAND and NOR gates.

FIG. 5 is a process flow diagram of a non-destructive method of detecting die crack problems in accordance with a preferred embodiment of the present invention.

FIG. 6 is a block diagram of a simplified die crack test system in accordance with a preferred embodiment of the present invention.

FIG. 7 depicts an example of a logic gate tree structure at the perimeter of a die and a table showing a test pattern in accordance with a preferred embodiment of the present invention.

DETAILED DESCRIPTION OF THE PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a non-destructive method of detecting die crack problems in an integrated circuit. The method provides for testing for die crack problems in all chips and in many production chips without adding any extra circuitry or pads. In a preferred embodiment, the method takes advantage of an existing NAND gate tree structure at the perimeter of many conventional dies, for example, the LXA0372, manufactured by LSI Logic Corporation, Milpitas, Calif.

The invention recognizes that this NAND gate tree structure may be used in order to identify and localize die cracks in finished chips, thereby providing a faster, more accurate and nondestructive way to test for die cracks in production chips. A typical NAND (all inputs equal 1; output equals 0; otherwise output equals 1) gate tree structure has the form of a cascade inverter chain. Since one end of the first NAND gate is tied to $V_{DD}$, the output of each gate will alternate between low and high. Knowing the number of NAND gates in chain and the input provided to each NAND gate, the output for a properly functioning chain is determinable. If the output received is unexpected, it is an indication of die cracking in the chip. Moreover, by conducting a test pattern where a range, ideally the minimum combination necessary, of inputs is provided at each NAND gate and the output recorded, it is possible to localize the gate and or gates which are not responding properly and thereby localize the die crack.

Since, in a preferred embodiment, this test method requires no new circuitry in a conventional chip design, it is both low cost and efficient use of chip area. A test protocol including a cycle which provides the permutations of inputs to the NAND gates necessary to identify and localize die cracking may be provided to the customer together with the production chip. Thus, if a chip fails, the customer may run the test protocol in order to determine if the failure is due to die cracking rather than some problem with the chips's function circuits, and localize the die crack.

Generally, this method is not restricted to NAND gate tree structures. The input nodes may include NOR logic gates, or a combination thereof. NAND gate tree structures are the preferred embodiment since they are already present in many chip designs. The invention is also applicable to other logic gate structures that may exist or may be formed at the perimeter of dies.

FIG. 2 shows a simplified top schematic view of a representative production chip die having a NAND gate tree structure at its perimeter. As noted above, an example of such a die is the LXA0372, manufactured by LSI Logic Corporation, Milpitas, Calif. The die 200 includes a function circuit 202 surrounded by a number of input nodes (or "pins") 204, which may be bidirectional, and output nodes 206 (many of which are not important in the context of this invention) at the perimeter of the die 100. Such a die will typically have hundreds of pins, however the die 200 is shown in simplified form with many fewer pins in order to focus on the NAND tree structure aspect of the die 200.

The NAND gate tree structure 210 is intended to be used in order to check for defects in the fabrication process of the die. Specifically, the NAND tree structure 210 is used to check for the strength and uniformity of the p- or n-doped diffusions in the semiconductor substrate used to produce the die. After the dies are cut from the wafer following fabrication, and packaged, the NAND gate tree structure is used to confirm earlier random spot testing of the strength and uniformity of the diffusion doping in the substrate according to a technique well known those with skill in the art. The present inventors have recognized that this NAND gate tree structure 210 may be used in order to identify and localize die cracks in finished chips, thereby providing a faster, more accurate and nondestructive way to test for die cracks in production chips.

As noted above, a typical NAND gate tree structure 210 has the form of a cascade inverter chain. The inverters are CMOS devices having both NMOS and PMOS transistors. For testing in accordance with one embodiment of the present invention, $V_{IH}$ is forced to equal $V_{DD}$ and $V_{IL}$ to equal $V_{SS}$ to make sure the channel of the PMOS and that of the NMOS are formed in strong inversions or complete depletions. Then if the input voltage equals $V_{DD}$ the p-channel is completely depleted, which means the PMOS is shut off with zero leakage current. Meanwhile the n-channel is in strong inversion which means the n-channel turns on with the minimum resistance. The output voltage of the inverter will be close to $V_{SS}$ (0). If the input voltage equals $V_{SS}$, the n-channel is in depletion which means that the n-channel will be off and the p-channel is in strong inversion which means the PMOS transistor will be on with the minimum resistance the output voltage will go to high (1), close to $V_{DD}$ level.

FIG. 3 depicts a simplified top schematic view of the representative production die of FIG. 2, focusing on the NAND tree structure at the perimeter of the die. The tree structure 210 around the perimeter of the die 200 has twelve input nodes 204, twelve NAND gates 208, and a single output node 220. Given the number of NAND gates in the tree structure and the inputs applied, the output at the end of the tree structure may be determined with certainty. If the expected result is not obtained, it is an indication of a die crack problem. With the example depicted in FIGS. 2 and 3, there is an even number of NAND gates (12). When the inputs are all high, the tree structure behaves as a cascade inverter so that the output of each successive gate is the inverse of that which precedes it. Alternatation between 0 and 1 an even number of times means that the expected voltage signal at the output node 220 at the end of the tree is high (1).

Changing the voltage signals applied to one or more input nodes to low (0) affects the voltage signal at the output node 220 in a predictable way. A set of inputs applied to the nodes of a tree structure may be referred to as a "vector." A pattern (or "cycle") of vectors may be applied to the input nodes 204 in order to confirm the proper functioning of each gate 208 in the tree structure, which indicates that there are no die crack problems. The pattern may include any permutation of input voltage signal vectors up to all of the possible combination of inputs applied at the input nodes 204. In a preferred embodiment, a pattern with the minimum number of vectors necessary to determine the proper operation of each gate in the tree, that is, to identify and localize and die crack problem, is used. The pattern of input voltages is preferably applied, and the outputs determined, under the control of a computer-implemented protocol. The computer-implemented protocol may be provided to users of the production chips, so that they may conduct nondestructive tests of chips in accordance with the present invention, thereby eliminating the need to return failed chips to the manufacturer for costly and time-consuming decapping procedures.

It should be noted that FIGS. 2 and 3 depict only one preferred embodiment of the preset invention. The preferred embodiment includes only one output pin. In other embodiments of the present invention, more than one output pin might be used, for example where the perimeter of a die was divided into segments for testing in accordance with the present invention. However, a single output pin is used in the preferred embodiment because it is present in the NAND gate tree structure already existing in many production dies, it uses a minimum amount of area on the die, and requires no extra processing for additional circuitry or pads.

Also, the preferred embodiment has a tree structure composed of NAND gates. It should be understood that in other embodiments of the present invention the tree structure may be composed of logic gates other than NAND gates, such as NOR gates, or a tree composed of a combination of NAND and NOR gates.

FIG. 4 illustrates one such alternative embodiment in accordance with the present invention, having a logic gate tree 400 composed of a combination of NAND and NOR gates. Such a tree structure may be particularly useful in to detect die cracks which may occur in some but not all layers of a die. For example, the NAND gate portion 402 of the tree 400 may be in one layer, such as a metal 1 layer, while the NOR gate portion 404 of the tree 400 may be in another layer, such as polysilicon or metal 2. The output of the tree may be run through a multiplexer (MUX) 406 in order to properly interpret the test data.

FIG. 5 is a process flow diagram of a non-destructive method of detecting die crack problems in accordance with a preferred embodiment of the present invention. The process begins at 501, and at a step 502 an integrated circuit on a die having a logic gate tree structure around the perimeter of the die is provided. The logic gate tree structure includes a chain of input nodes connected with logic gates and one output node. As noted above, the design of some current chips incorporates a NAND gate tree structure at the perimeter of the die for purposes unrelated to the detection of die cracking. In a preferred embodiment of the present invention, this existing NAND gate tree structure is used for detection of die cracking.

At a step 504, a pattern of voltage signals is applied at each of the input nodes. The output of each NAND gate in the tree is determined by the inputs it receives. Given the number of NAND gates in the tree structure and the inputs applied, the output at the end of the tree structure for each permutation of the pattern, may be determined, at a step 506, with certainty. If an expected result is not obtained, it is an indication of a die crack problem, determined at a step 508. For example, if a logic high (1) is the expected output of a test vector, and there is a die crack breaking the logic tree, the output may be a "/"; or if a logic low (0) is the expected output of a test vector, and there is a die crack breaking the logic tree, the output may be a "bot." The process ends at 510.

FIG. 6 is a block diagram of a simplified die crack test system in accordance with a preferred embodiment of the present invention. The system 600 includes an integrated circuit on a die 602 having a logic gate tree structure with a chain of input nodes connected with logic gates and at least one output node around the perimeter of the die. The system also includes a computer-implemented protocol 604 for controlling the application of a pattern of voltage signals at the input nodes, and determining the voltage signals for each permutation of the pattern at at least one output node. The computer-implemented protocol may be software or firmware which operates via a test device to provide a pattern of inputs which are applied to the input nodes on the die in order to determine whether there are die crack problems. As noted above, the pattern of inputs may include any permutation of input voltage signals up to all of the possible combination of inputs applied at the input nodes. In a preferred embodiment, a pattern with the minimum number of inputs necessary to determine the proper operation of each gate in the tree, that is, to identify and localize and die crack problem, is used.

The computer-implemented protocol 604 may be provided to the user in electronic form on or via any media 606 known in the art, and may be implemented by the user on a test device 608 which includes a hardware interface for the chips, such as are well known in the art. Alternatively, the user may be provided with a test device 610 configured to test the chips with the computer-implemented protocol, together with the chips 602 and protocol 604 as part of the system 600.

The system of the present invention allows users of the production chips to conduct nondestructive tests of chips in accordance with the present invention, thereby eliminating the need to return failed chips to the manufacturer for costly and time-consuming decapping procedures.

EXAMPLE

The following example provides details concerning the a preferred implementation of the present invention. It should be understood the following is representative only, and that the invention is not limited by the detail set forth in this example.

FIG. 7 depicts an example of a logic gate tree structure 702 at the perimeter of a die and a table 704 showing a test pattern in accordance with a preferred embodiment of the present invention. The tree structure is composed of NAND gates D1, D2, D3 and D4 connected by links L1, L2 and L3. The inputs to gate D1 are $V_{DD}$ and the signal applied at node A. The inputs to gate D2 are the output of gate D1 on link L1 and the signal applied at node B. The inputs to gate D3 are the output of gate D2 on link L2 and the signal applied at node C. The inputs to gate D4 are the output of gate D3 on link L3 and the signal applied at node D.

In the example, the test pattern described in the table 704 is applied to the tree structure 702. The test pattern is composed of five vectors of input signals. In this example, link L1 is broken due to the presence of a die crack. With L1 broken, the first two vectors will fail (since the input at node B is a logic high (1)), but the output will function properly when the input at node B is low (0) in the third ($3^{rd}$) vector (since with B low the output of gate D2 must be 1). Vectors 4 and 5 will function properly since inputs C and D being low (0), respectively, mean that the outputs of gate D3 and D4, reseepctively, will be 1. Given this result, it can be determined that there is a die crack at L1.

Although the foregoing invention has been described in some detail for purposes of clarity of understanding, it will be apparent that certain changes and modifications may be practiced within the scope of the appended claims. For example, tree structure at the perimeter of the die could be composed of gates other than NAND gates, such as NOR gates, or a combination of NAND and NOR gates. Accordingly, the present embodiments are to be considered as illustrative and not restrictive, and the invention is not to be limited to the details given herein, but may be modified within the scope and equivalents of the appended claims.

What is claimed is:

1. A method of detecting die crack problems in an integrated circuit, comprising:

providing an integrated circuit on a die having a logic gate tree structure around the perimeter of the die, said integrated circuit having a plurality of input nodes and said logic gate tree structure comprising logic gates to connect at least two of the plurality of input nodes of the integrated circuit and at least one output node;

applying a pattern of voltage signals at said plurality of input nodes;

determining voltage signals at said at least one output node for said applied pattern of voltage signals;

wherein the voltage signals at the at least one output node provide an indication of whether or not there is a die crack.

2. The method of claim 1, wherein said logic gates are selected from at least one of NAND gates and NOR gates.

3. The method of claim 1, wherein said at least one output node is a single output node.

4. The method of claim 3, wherein all of the plurality of input nodes are connected using logic gates to the single output node and wherein said logic gates are selected from at least one of NAND gates and NOR gates.

5. The method of claim 1, wherein one end of a first of two ends of a first NAND gate in said tree structure is tied to $V_{DD}$ and the second end is tied to a first input node.

6. The method of claim 1, wherein:

said plurality of input nodes are connected to NAND gates;

said at least one output node is a single output node;

one end of a first of two ends of a first NAND gate in said tree structure is tied to $V_{DD}$ and the second end is tied to a first input node;

each additional NAND gate in said tree structure has a first of two ends tied to an output of a preceding NAND gate in the tree structure and the second end tied to a an input node; and the output from a last NAND gate in said tree structure is tied to said output node;

whereby a high signal at said output node when a high signal is applied to an even number of said input nodes, or a low signal at said output node when a high signal is applied to an odd number of said input nodes, indicates no die crack problems.

7. The method of claim 1, wherein said integrated circuit is encapsulated in a package.

8. The method of claim 7, wherein said determination is made without decapping said packaged integrated circuit.

9. A method of detecting die crack problems in an integrated circuit, comprising:

providing an integrated circuit on a die having a logic gate tree structure around the perimeter of the die, said logic gate tree structure comprising a plurality of input nodes connected with logic gates and at least one output node;

applying under the control of a computer-implemented protocol a pattern of voltage signals at said plurality of input nodes in permutations that permit localization of any die crack problem and wherein the permutations are a minimum number of vectors necessary to determine the proper operation of each gate in the tree; and determining under the control of a computer-implemented protocol voltage signals at said at least one output node for said applied pattern of voltage signals;

wherein the voltage signals at the at least one output node provide an indication of whether or not there is a die crack.

10. The method of claim 9, wherein said integrated circuit is encapsulated in a package.

11. The method of claim 10, wherein said determination is made without decapping said packaged integrated circuit.

12. A system for detecting die crack problems in an integrated circuit, comprising:

an integrated circuit on a die having a logic gate tree structure around the perimeter of the die, said integrated circuit having a plurality of input nodes and said logic gate tree structure comprising logic gates to connect at least two of the plurality of input nodes of the integrated circuit and at least one output node;

a computer-implemented protocol capable of controlling the application of a pattern of voltage signals at said plurality of input nodes, and determining voltage signals at said at least one output node for said applied pattern of voltage signals; and a test device configured to interface said integrated circuit and said computer-implemented protocol;

wherein the voltage signals at the at least one output node provide an indication of whether or not there is a die crack.

13. The system of claim 12 wherein said at least one output node is a single output node and all of the plurality of input nodes are connected using logic gates to the single output node and wherein said logic gates are selected from at least one of NAND gates and NOR gates.

14. The system of claim 12, wherein said test device comprises a test board.

15. The system of claim 12, wherein said logic gate tree structure comprises NAND gates.

16. The system of claim 12, wherein said at least one output node is a single output node.

17. The system of claim 12, wherein one end of a first of two ends of a first NAND gate in said tree structure is tied to $V_{DD}$ and the second end is tied to a first input node.

18. The system of claim 12, wherein:

said plurality of input nodes are NAND gates;

said at least one output node is a single output node;

one end of a first of two ends of a first NAND gate in said tree structure is tied to $V_{DD}$ and the second end is tied to a first input node;

each additional NAND gate in said tree structure has a first of two ends tied to an output of a preceding NAND gate in the tree structure and the second end is tied to a an input node; and the output from a last NAND gate in said tree structure is tied to said output node;

whereby a high signal at said output node when a high signal is applied to an even number of said input nodes, or a low signal at said output node when a high signal is applied to an odd number of said input nodes indicates no die crack problems.

19. The system of claim 12, wherein said integrated circuit is encapsulated in a package.

20. The system of claim 19, wherein said determination is made without decapping said packaged integrated circuit.

21. A system for detecting die crack problems in an integrated circuit, comprising:

an integrated circuit on a die having a logic gate tree structure around the perimeter of the die, said logic gate tree structure comprising a plurality of input nodes and at least one output node;

a computer-implemented protocol configured to control the application of a pattern of voltage signals at said plurality of input nodes, and to determine voltage signals at said at least one output node for said applied pattern of voltage signals; and a test device interfacing said integrated circuit and said computer-implemented protocol; wherein the pattern of voltages are applied to the input nodes in permutations that permit localization of any die crack problem and the permutations are a minimum number of vectors necessary to determine the proper operation of each gate in the tree; and wherein the voltage signals at the at least one output node provide an indication of whether or not there is a die crack.

22. The system of claim 21, wherein said integrated circuit is encapsulated in a package and wherein said determination is made without decapping said packaged integrated circuit.

* * * * *